United States Patent [19]

Rafferty et al.

[11] Patent Number: 4,647,864
[45] Date of Patent: Mar. 3, 1987

[54] VARIABLE-DELAY, SINE-COSINE NON-COHERENT DEMODULATOR

[75] Inventors: William Rafferty, Pasadena, Calif.; Gary J. Saulnier, Clifton Park, N.Y.

[73] Assignee: General Electric Company, Schenectady, N.Y.

[21] Appl. No.: 854,357

[22] Filed: Apr. 21, 1986

[51] Int. Cl.$^4$ ............................................. H03D 3/00
[52] U.S. Cl. ................................... 329/122; 329/110; 375/78
[58] Field of Search .............. 329/110, 112, 122, 124; 375/44, 45, 46, 52, 78, 79, 81, 83; 455/205, 208

[56] References Cited

U.S. PATENT DOCUMENTS 4,584,534  4/1986  Lijphart et al. ................. 329/110 X Primary Examiner—Eugene R. LaRoche
Assistant Examiner—Robert J. Pascal
Attorney, Agent, or Firm—Geoffrey H. Krauss; James C. Davis, Jr.; Marvin Snyder

[57] ABSTRACT

A variable-delay, sine-cosine non-coherent demodulator recovers digital data angle-modulated upon a radio-frequency (RF) carrier signal, by frequency conversion of the carrier signal to a selected IF frequency, which is ideally equal to one-fourth of a sample frequency supplied to the demodulator. The IF signal is sampled at the sample frequency, and the samples are then sorted to provide a pair of baseband quadrature-phased I and Q signals. Each of the I and Q signals is delayed by a variable first delay $T_1$ to provide first-delayed in-phase $I_1$ and first-delayed quadrature-phased $Q_1$ signals. These signals are then delayed by a second delay $T_2$ to provide twice-delayed in-phase $I_2$ and twice-delay quadrature-phase $Q_2$ signals. The sum of the two delays is a constant related to the sample frequency, which itself is related to the data bit rate, but the first delay $T_1$ is variably dependent upon the frequency offset between the IF signal and the sample signal. The various signals are applied to a sine (discriminator) detector and to a cosine (differential) detector, with the output of a selected detector being filtered and processed to provide the recovered data. The detected data output is also utilized to control the first and second delays and to provide, in coordination with the discriminator detector output, automatic frequency control of an oscillator, in the frequency converter means, to minimize the difference between the IF signal frequency and the desired submultiple of the sample frequency.

20 Claims, 9 Drawing Figures

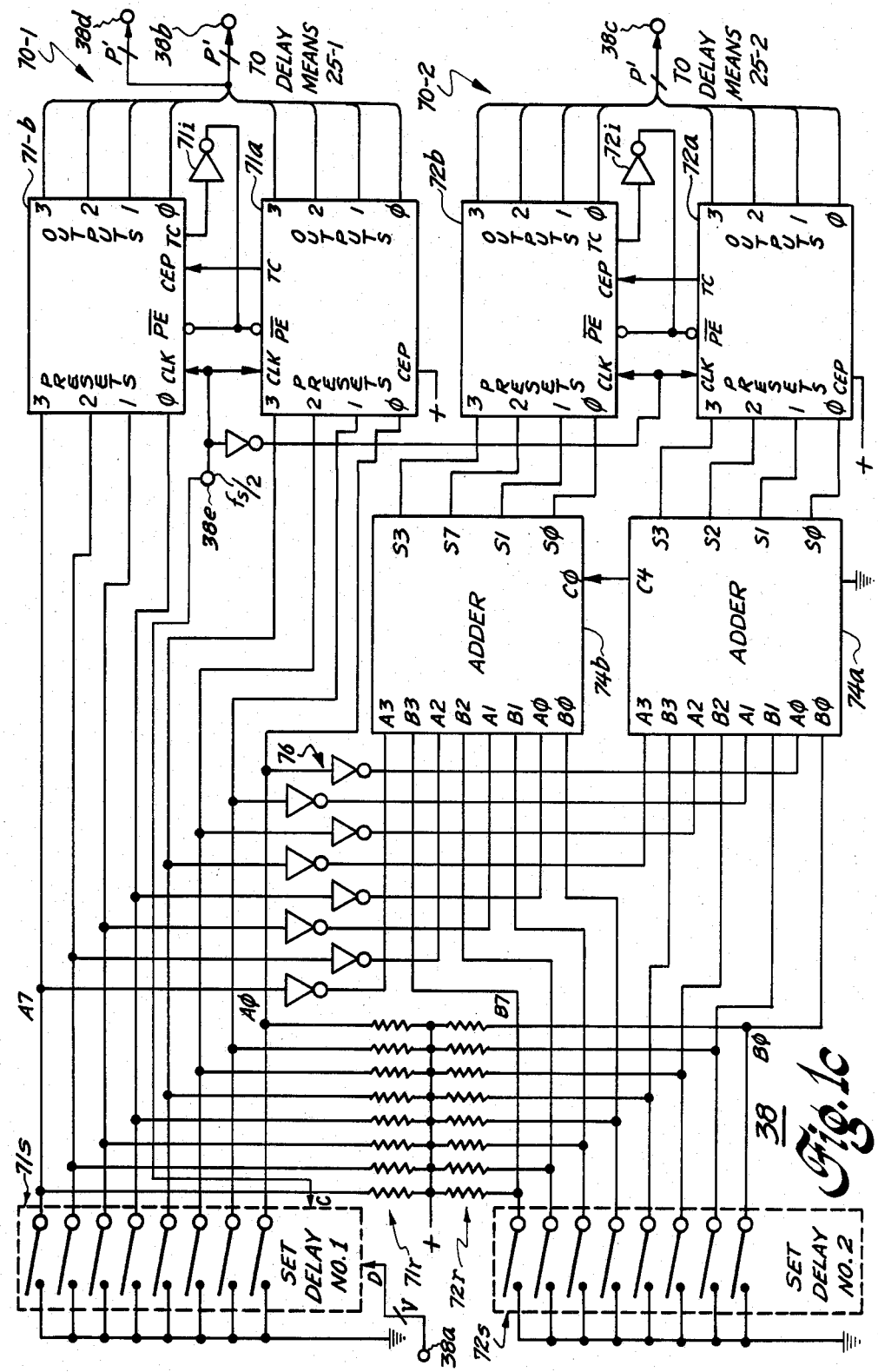

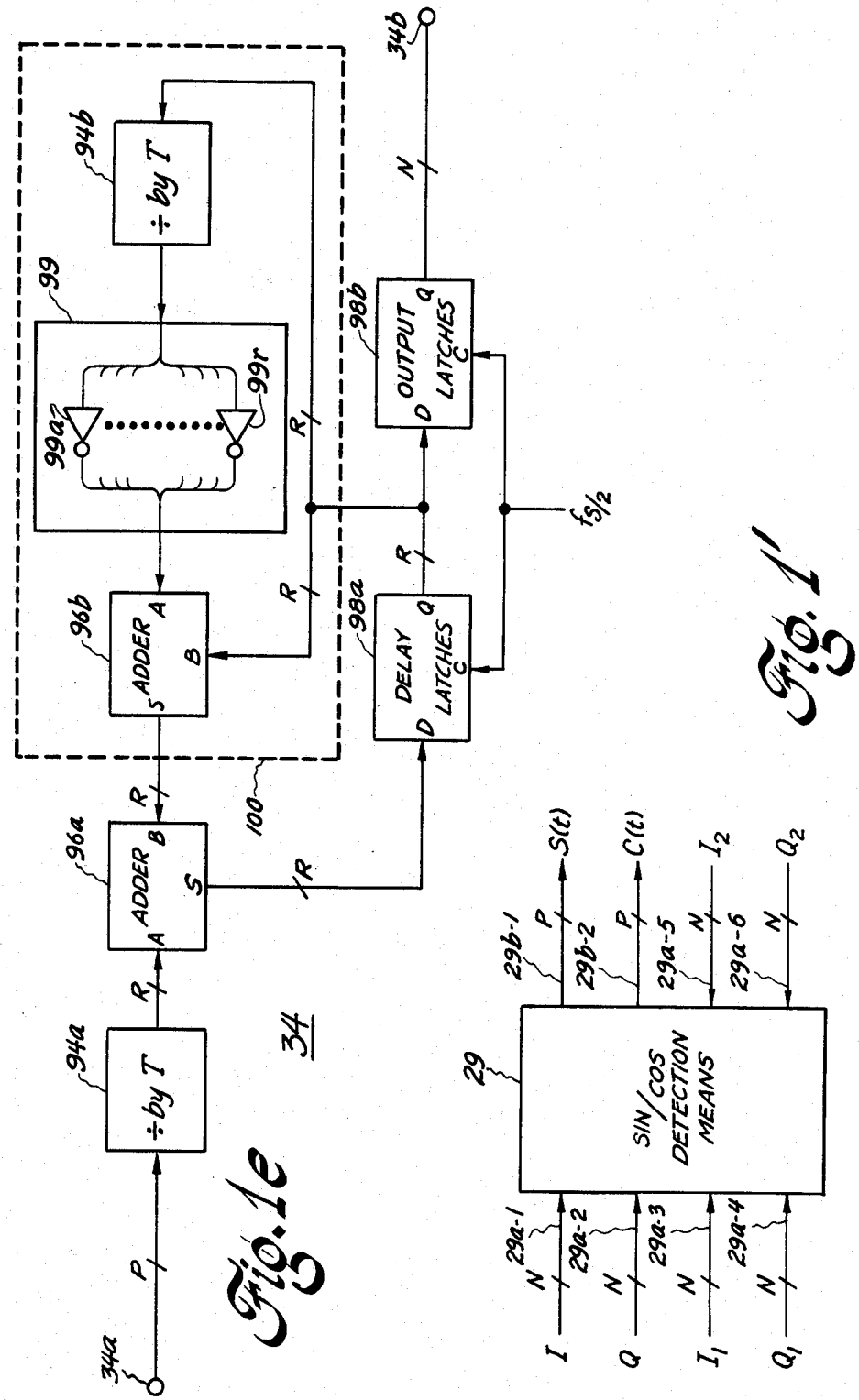

1

VARIABLE-DELAY, SINE-COSINE NON-COHERENT DEMODULATOR

BACKGROUND OF THE INVENTION

The present invention relates to apparatus for demodulating information from a radio communications carrier signal and, more particularly, to novel non-coherent demodulators providing improved data detection performance for received signals having information modulated thereon by angle modulation, such as narrow band frequency modulation, techniques.

It is well known that transceivers for the radio communication of information by analog voice techniques, such as is used in the conventional Land Mobile Radio services, advantageously utilize narrow band frequency modulation (FM) techniques. In such FM transceivers, the received signal is often converted to an intermediate frequency (IF) and the information thereon is demodulated using a quadrature detector. Further, data communication links which may have transmission of a "burst", or short durational, nature require that the receiver section, of any transceiver utlized in the system, by able to rapidly acquire the transmitted signal. The rapid acquisition requirement is typically satisfied by utilizing non-coherent demodulator techniques. In conventional Land Mobile Radio systems utilizing narrow band FM, the non-coherent demodulator is usually implemented as a quadrature detector, which performs as a time-differentiator by producing a voltage which is proportional to the received signal instantaneous frequency. Thus, the output of the quadrature detector is recovered data which has been frequency modulated onto the transmitted carrier. However, since the quadrature detector is deliberately made sensitive to the received signal frequency, any frequency offset from the nominal carrier frequency will distort the recovered data. While it is possible to reduce the effect of frequency offset for the quadrature detector, this imposes an unreasonable frequency stability requirement on the overall communications link. Consequently, the quadrature detector is configured to be a compromise between data detection peformance and received signal acquisition range.

These same transceivers are often utilized with other, more modern techniques for digital data and digital secure voice transmissions, wherein the efficacy of the quadrature detector is considerably less than its efficacy for analog voice transmission. In any service where both analog and digital voice and data transmissions may occur, the trade-off of demodulation performance against received signal frequency acquisition is a major disadvantage of a quadrature detector and may result in system performance which can be significantly less than desired. It is highly desirable that the demodulator operate upon many forms of carrier signals having what we term "angle", or non-amplitude, modulation; this includes frequency modulations such as narrowband frequency modulation (FM) and continuous-phase frequency shift keying (CPFSK) and phase modulations such as phase shift keying (PSK), either as of binary BPSK or of M-ary MPSK nature. Accordingly, we desire to provide a non-coherent demodulator which receives angle-modulation signals, possibly having a substantial frequency offset, and detects digital data/-voice information therefrom.

BRIEF SUMMARY OF THE INVENTION

In accordance with the invention, a variable-delay, sine-cosine non-coherent demodulator for recovering digital data angle-modulated upon a radio-frequency (RF) carrier signal, utilizes frequency conversion means to change the frequency of the RF carrier signal to an IF frequency substantially at a desired demodulation frequency, which is set equal to one-fourth of a sample frequency supplied to the demodulator. The IF analog signal is sampled, at the sample frequency, and the samples are then sorted to provide a pair of baseband quadrature-phased I and Q signals. Each of the I and Q signals is delayed by a variable first delay $T_1$ to provide first-delayed in-phase $I_1$ and first-delayed quadrature-phased $Q_1$ signals, and is then delayed by a second delay $T_2$ to provide twice-delayed in-phase $I_2$ and twice-delayed quadrature-phase $Q_2$ signals. A delay control means sets both the first delay and the second delay such that the sum of the two delays is a constant related to the sample frequency, which itself is related to the data bit rate. The various non-delayed and delayed in-phase and quadrature-phase signals are applied to a sine (discriminator) detector and to a cosine (differential) detector. The output of a selected detector is filtered and processed to provide the recovered data. The detected data output is also utilized to control the first and second delays and to provide, in coordination with the discriminator detector output, automatic frequency control of an oscillator, utilized in the frequency conversion means, to maintain the IF signal at the desired submultiple of the sample frequency.

In presently preferred embodiments of the invention, a unitary sine/cosine detector is utilized, and the entire data demodulator is implemented substantially in digital logic, whereby all of the various demodulator portions can be integrated in a single monolithic semiconductor integrated circuit.

Accordingly, it is an object of the present invention to provide a demodulator having improved performance with respect to digital data demodulation, even if the input frequency is substantially offset from an expected frequency.

This and other objects of the present invention will become apparent upon consideration of the following detailed description, when read in conjunction with the drawings.

BRIEF DESCRIPTION OF THE DRAWINGS

FIG. 1' is a block diagram of a portion of the demodulator of FIG. 1, illustrating a unitary discriminator-differential detector for use therein;

FIG. 1c is a schematic block diagram of circuitry for realizing one presently preferred embodiment of a delay controller means for generating random-access memory addresses;

FIG. 1e is a schematic block diagram of circuitry for realizing one presently preferred embodiment of the infinite-impulse-response (IIR) filter means;

DETAILED DESCRIPTION OF PREFERRED EMBODIMENTS

Figure 1:
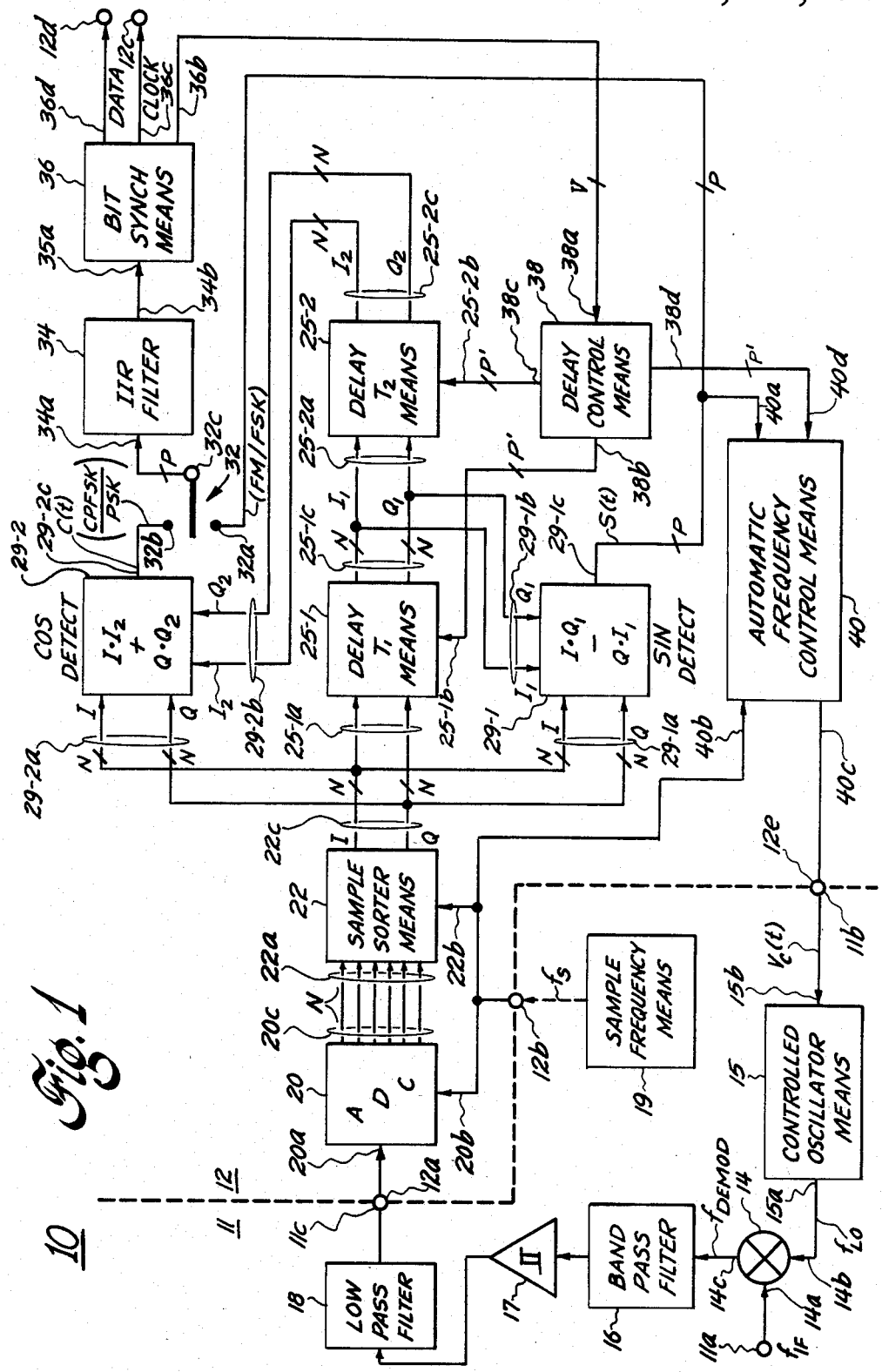
FIG. 1 is a block diagram of a portion of a receiver utilizing a data demodulator in accordance with the principles of the present invention, having separate discriminator and differential detectors.

Referring initially to FIG. 1, in a digital communications system wherein data is transmitted using angle modulation, such as FM, FSK, CPFSK and the like, our novel variable-delay, sine-cosine non-coherent demodulator 10 includes an intermediate-frequency (IF) portion 11 and a detection portion 12. Advantageously, all of detection portion 12 will be integrated in a single monolithic semiconductor circuit; if possible, the various means of IF portion 11 will also be integrated in the same IC as portion 12. It will be understood that any known technology may be utilized for the front-end of the receiver, which provides the signal at the IF frequency $f_{IF}$ to the IF section input 11a. It is desirable to operate the demodulator generally with a signal at some known demodulation center IF frequency, $f_{DEMOD}$, provided at its input 12a. By way of illustration only, if demodulator 10 is provided in a Land Mobile Radio receiver operating in the 800–900 MHz. band, the intermediate frequency $f_{IF}$ may be on the order of 10.7 MHz., 21.4 MHz., or 45 MHz., and the demodulation frequency $f_{DEMOD}$ may be on the order of 455 KHz.

The IF frequency conversion portion 11 receives the IF radio-frequency signal at input 11a, for application to the RF input 14a of a frequency converter means 14. A local oscillator input 14b of that means receives a local oscillator signal having a local oscillator frequency $f_{LO}$, as provided at the output 15a of a controlled oscillator means 15. That is, the frequency $f_{LO}$ of means 15 is controlled responsive to a frequency control voltage $V_c(t)$ which is provided at a second input 11b, for coupling to a controlled oscillator means frequency control input 15b. After frequency conversion in means 14, the sum and different frequencies appear at the conversion means output 14c and are applied to a bandpass filter 16. The bandpass filter, having a center frequency substantially equal to the demodulator frequency $f_{DEMOD}$ (where $f_{DEMOD}=f_{IF}-f_{LO}$) attenuates all but one product of the mixer output and sets the pre-detection carrier-to-noise ratio. Bandpass filter 16 passes, with relatively low attenuation, substantially only the difference signal from the conversion means. The filtered signal is coupled to a hard-amplitude-limiter means 17. After being amplitude limited, the signal is low-pass filtered in a filter means 18, which removes all harmonics generated by the limiting action; the limited and filtered signal, to be demodulated, is thus provided at the first portion output 11c, for application to the detection portion input 12a.

The detection portion 12 not only receives the demodulation frequency signal at input 12a, but also receives a sample frequency $f_S$ signal at another input 12b, from a sample frequency generating means 19. This sample frequency is an integer multiple H of the demodulation frequency ($f_S=H \times f_{DEMOD}$); means 19 is any means capable of supplying the $f_S$ signal at the required frequency and amplitude (e.g., a crystal-controlled oscillator). For purposes of illustration, H=4 and $f_{DEMOD}=455$ KHz., whereby the sample frequency $f_S=1.82$ MHz. The IF signal to be demodulated is applied to an analog input 20a of an analog-to-digital converter (ADC) means 20, which also receives the sample frequency signal at a conversion-enable input 20b. Responsive to each cycle of the sample frequency $f_S$ signal at input 20b, ADC means 20 provides, at a data output port 20c, a multi-bit digital data word representative of the amplitude of the analog signal present at input 20a at that time. Illustratively, ADC means output port 20c provides a 6-bit digital representation, including sign, of the input signal. It will be understood that the sample frequency $f_S$ is also equal to the product of the data bit rate $R_b$ and the desired number of samples $N_s$ in each data bit time interval, or $f_S=2R_bN_s$. If, for example, the data bit rate $R_b$ is 9100 bps, each data bit will be sampled $N_s$ equal 100 times. The digitized IF signal is applied to the input port 22a of a sample sorter means 22, which also receives the sample frequency signal $f_S$ at an input 22b. Sorter means 22 acts to invert every other word of sample data in each pair of samples, and to de-multiplex the sequential pair of sample words into a time-concurrent pair of an in-phase I data word and a quadrature-phase Q data word, at a sample sorter means output 22c. Thus the digitized signal from ADC means 20 is translated to a pair of quadrature-phased baseband I and Q data words, or multi-bit parallel data signals.

The multi-bit I and Q signals are coupled from the sample sorter means output port 22c to the input port 25-1a of a first time delay means 25-1. The variable delay $T_1$ provided by means 25-1 is generally less than one bit time interval (bti) T, which is set by the data bit rate $R_b$, i.e., $T=1/R_b$. The exact delay $T_1$ provided by delay means 25-1 is controlled by a plurality P' of parallel data bits applied to a first delay means delay control input port 25-1b. The N data bits of each delayed in-phase signal $I_1$ and delayed quadrature-phase signal $Q_1$ are provided at the first delay means output port 25-1c. This output port is connected to the input port 25-2a of a second time delay means 25-2, which provides another variable time delay $T_2$ responsive to the P' bits of delay information provided to its delay control input port 25-2b. The twice-delayed in-phase signal $I_2$ and the twice-delayed quadrature phase signal $Q_2$, each with N parallel bits of resolution, is provided at the second delay means output port 25-2c. The second delay means delay time interval $T_2$ is set such that the sum of the first and second delay means delay time intervals $T_1+T_2$ is substantially equal to twice the bti, or $2T=T_1+T_2=2/R_b$ (illustratively, with $R_b=9100$ bps, the total delay is about $T_1+T_2=219.8$ microseconds and $T_1$ is less than 109.9 microseconds).

A sine detection means 29-1 receives the non-delayed I and Q signals at a first input port 29-1a and receives the once-delayed signals $I_1$ and $Q_1$ at a second input port 29-1b. The sine detector means output port 29-1c provides a sine detector output S(t) word with a data value which is defined by the difference between the product $I \cdot Q_1$ and the product $Q \cdot I_1$, or $S(t)IQ_1-QI_1$. This signal has an S-shaped discriminator amplitude vs. frequency characteristic and provides a detected data signal when the received signal is either a frequency-modulator (FM) signal or a frequency-shift-keyed (FSK) signal.

This signal is also a measure of the offset of the instantaneous received frequency, at the IF input 11a, with respect to one-quarter of the sample frequency, and can be utilized, as will be explained hereinbelow, as a frequency control error signal in an automatic frequency control (AFC) loop.

The non-delayed I and Q signals are also applied to a first input port 29-2a of a cosine detection means 29-2. This is a 2-bit differential detector which operates by comparing the phase of the presently-received symbol to the phase of the symbol received two bti's previously; therefore detection means 29-2 also receives the twice-delayed $I_2$ and $Q_2$ signals at a second input port 29-2b. An output port 29-c of this detector has the data for a signal C(t) thereon. Signal C(t) is related to the sum of the twice-delayed and non-delayed in-phase and quadrature-phased signals, with $C(t) = II_2 + QQ_2$. The output of this detector is demodulated data if the IF signal at input 11a is either a continuous-phase frequency shift keyed (CPFSK) signal, where the transmitted data is conveyed in the phase difference between the n-th and (n-2)-th symbols and typically utilized with a 0.5 deviation ratio for data transmissions in narrow band LMR channels, or a phase-shift-keyed (PSK) signal. Since a 2-bit differential detector is actually performing a form of time differentiation, the detector is very sensitive to time, or frequency, changes or offsets. Therefore, the input signal must be tracked, to frequency lock the $f_{DEMOD}$ signal to $f_S/4$, for proper data demodulation.

Each bit of the sine detector output port 29-1c is coupled to the associated first selectable terminals 32a of a switching means 32, while each bit of the cosine detector output port 29-2c is connected to an associated one of other selectable terminals 32b of the switch means. The switch means common terminals 32c provide the data from a detector selected dependent upon which form of angle modulation is being selected for reception. The selected data is connected to the input port 34a of a single-pole infinite-impulse-response (IIR) filter means 34, for removal of excess noise from the detected data. The filtered detected data at filter output port 34b is applied to the input port 36a of a bit synchronization means 36. Synchronization, or bit timing recovery, means 36 (which may be of any utilizable form known to the art, such as that described in "Performance of a Binary Quantized All-digital Phase-locked Loop with a New Class of Sequential Filters", by Yamamoto and Mori, IEEE Trans. 1978, COM-26, pp 35-44, and the like) has a first output port 36b at which is provided a data signal, with a plurality V of bits, for delay control. The detected data bits are utilized to provide a data clock signal at means output 36c, for coupling to a demodulator clock output terminal 12c, and to provide the actual data signals at means data output port 36d for coupling to a demodulator data output port 12d, for use as required.

The delay control data at output port 36b is connected to the input port 38a of a delay control means 38. Responsive to the data word received at input port 38a, delay control means 38 sets the first delay $T_1$ by control of the P' bits of data at a first output port 38b, and controls the second delay time interval $T_2$ by the data provided at a second output port 38c. The first delay $T_1$ is generally started at a low value (say, $T_1 = 0.12T$), with $T_2$ being a high value ($2T - 0.12T = 1.88T$) and an increase in the count represented by the input 38a data word causes $T_1$ to be increased toward some value close to, but still less than, T, e.g., $T_1 = 0.84T$, while $T_2$ is concurrently decreased (toward $T_2 = 1.16T$) as the demodulator IF frequency is drawn close to, and finally locked at, $f_S/4$. This frequency locking process is controlled by an automatic frequency control (AFC) means which receives the sine detector output signal S(t) at a first input port 40a and receives the sample frequency $f_S$ signal at a second input 40b, and which generally also receives another set of data at an input port 40d from a delay control means output port 38d, for use as described in greater detail hereinbelow. AFC means 40 provides an output 40c signal to a demodulator output terminal 12e, for providing the frequency control signal at input 11b.

Figure 1A:
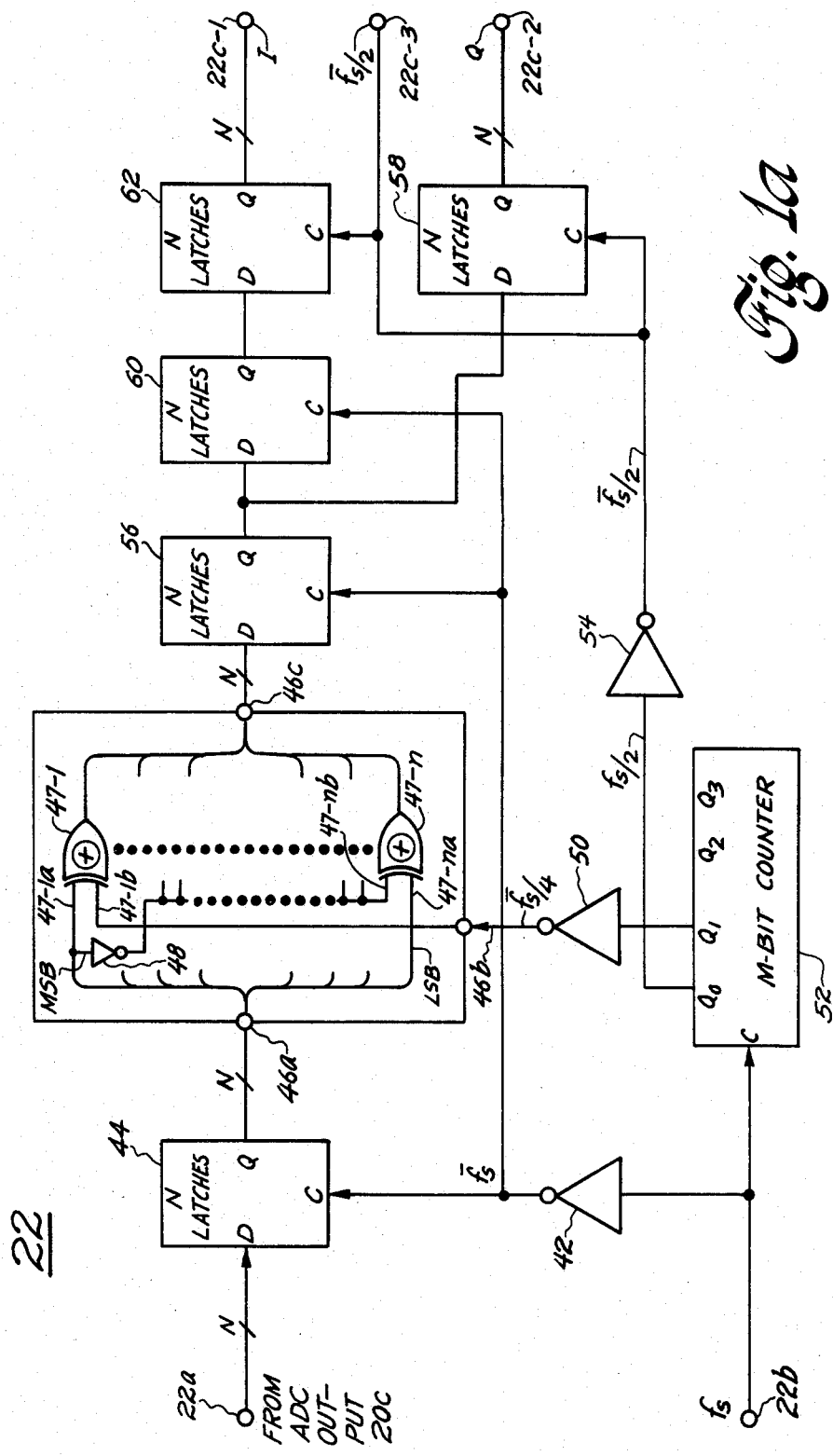
FIG. 1a is a schematic block diagram of circuitry for realizing one presently preferred embodiment of the sample sorter means of the demodulator of FIG. 1.

Referring now to FIG. 1a, sample sorter means 22 receives at its data input port 22a, as discussed hereinabove, the N parallel bits of a data word from ADC means digital output port 20c. The sorter means also receives the sample frequency $f_S$ signal at its sample input 22b. The sample frequency signal, which ideally has a square waveform, is inverted in a first inversion means 42 to provide a first inverted sample signal to the clock C input of a first latch means 44 having N parallel latches. The data D input of each different one of the first latches 44 receives the digital signal on a different one of the N data lines from sample sorter input port 22a. The latched bit of data at the Q output of each of the N latches 44 is connected, to the associated one of N first inputs 46a of a sorter means 46. The sorter means contains a plurality N of exclusive-OR getes 48-1 through 48-n, each having a first input receiving an associated one of the bits of latched data from sorter means input 46a. Thus, the most significant bit MSB data input is connected to a first input 47-1a of a first exclusive-OR gate 47-1 while the least significant bit LSB from input 46a is connected to the first input 47-na of the n-th gate 47-n. The second input 47-1b of the one gate receiving MSB data receives a signal from a second sorter means input 46b. The remainder of the gate second inputs 47-2b through 47-mb receive the inverted MSB signal, at the output of an inverter 48. The output of each of the N gates is connected to the one associated one of a like plurality of parallel lines at the sorter means output port 46c. The signal at sorter means second input 46b is at one-fourth the sample frequency, as provided at the output of another inverter 50, having its input connected to the second stage output $Q_1$ of a multiple-stage binary M-bit counter means 52 (here, M is at least two). The sample frequency signal at input 22b is connected to the clock input of counter means 52; the input of yet another inverter means 54 is connected to the first stage $Q_0$ output, to provide a half-sample-frequency signal. Each of the N data signals from sorter means output 46c is separately applied to an associated data input D of an associated one of a plurality N of second data latch means 56. A clock C input of each of the latches 56 receives the inverted sample frequency signal from the output of inverter 42. The latch Q output of each of latches 56 is coupled (1) to the corresponding data input of the corresponding stage in a plurality N of third latch means 58, each receiving the inverted half-sample-frequency signal from inverter 54 at its clock C input, and (2) to the data D input of the corresponding one of a plurality N of fourth latch means 60, each receiving its clock C signal from the output of inverter 42. The Q output of each of the fourth latch means 60 is connected to the corresponding data D input of one of a plurality N of a fifth latch means 62, each of which receives a clock C signal from the output of half-sample-frequency inverter 54. It will thus be seen that the signals in fifth latch means 62 are delayed by an extra sample frequency clock signal cycle, by action of fourth latch means 60, over the signals in third latch means 58; since each latch of the third and fifth latch means 58 and 62, respectively, operate to provide substantially simultaneous outputs, responsive to the substantially simultaneous signal at the output of inverter 54, alternating one of the samples from the ADC output are delayed by a time interval inversely proportional to one sample frequency cycle, which, as the sample frequency is set for four times the IF frequency, causes the signal data at the outputs of latch means 62 to be synchronized, in quadrature, with the Q signal data at the output of latch means 58. The N-bit in-phase I signal digital data is thus provided at a first output port 22c-1 of the sorter means, while the N-bit quadrature-phased Q signal digital data is provided at a second output port 22c-2. The half-sample-frequency signal is provided at a synchronizing output 22c-3 of the sorter means. Each of N=8 latches can be integratable circuitry similar to that of a standard 74LS374 or the like integrated circuit, while a 4-bit counter and the inverters can respectively be similar to circuitry in respective 74163 and 7404 ICs and the like.

Figure 1B:
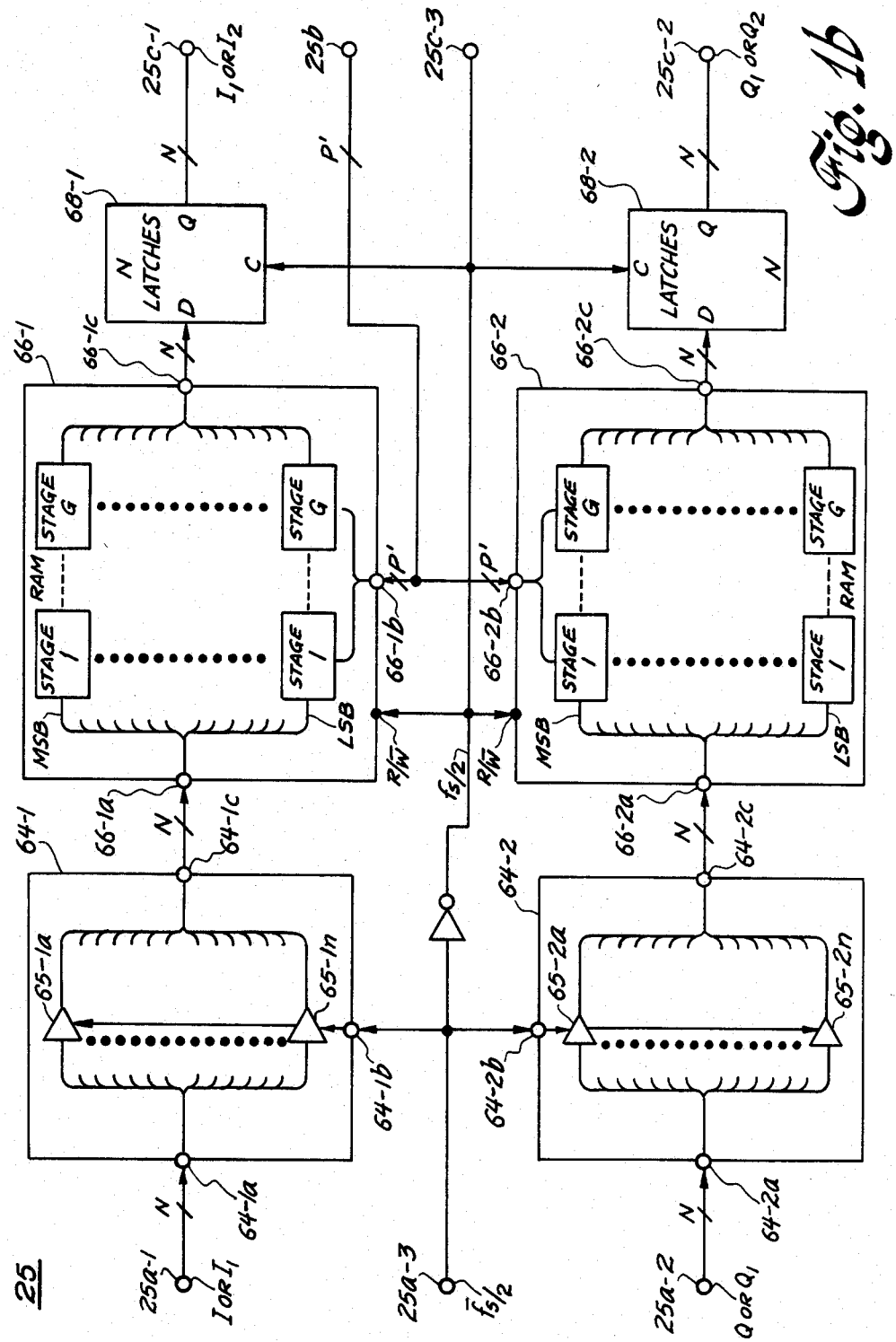
FIG. 1b is a schematic block diagram of circuitry for realizing one presently preferred embodiment of each of the pair of delay means.

Referring now to FIG. 1b, the first and second delay means 25-1 and 25-2 have essentially the same implementation architecture; a generalized delay means 25 is illustrated. The in-phase data signal I (in delay means 24-1) or $I_1$ (in delay means 25-2) is received at a first input port 25a-1, while the quadrature-phased data signal Q (in delay means 25-1) or $Q_1$ (in delay means 25-2) is received at another input port 25a-2. The half-sample-frequency signal is received at a third input 25a-3. Each of the N data lines from input ports 25a-1 or 25a-2 is connected to be associated ones of the N inputs of a first or second input buffer means 64-1 or 64-2, respectively. Each of buffer means 64 contains N buffers 65-1a through 65-1n or 65-2a through 65-2n (which may be provided by integratable circuitry like that in standard 74LS244 and the like ICs), with the output states thereof controlled by the signals at an auxiliary input 64-1b or 64-2b, from the half-sample-frequency signal. After buffering, the N-bit parallel data signals are provided to the at least N-bit-wide parallel data input port 66-1a or 66-2a of a multiple-bit random access memory (RAM) means 66-1 or 66-2, respectively. Each RAM means 66 can be considered to be N individual, but commonly clocked, shift registers, each having a plurality G stages of length. In the present application, each RAM has circuitry similar to that of a type 2114A (available from Intel Corp. and the like) integrated circuit, having 12 bits of width (of which only N=8 are here utilized), and using up to eitiher G=256 or G=512 steps per register. The entering parallel-data bits are received at the first stage and are clocked through the stages at a rate determined by the changing data of a plurality P' of address control bits provided at the transfer rate control input port 66-1b or 66-2b respectively, in accordance with the delay control signals provided at a delay means input port 25b. Thus, the time delay provided, from the time at which a N-bit data word is first applied to the first stage of each RAM until that same data word appears at the G-th stage and is made available at the RAM output port 66-1c or 66-2c, is determined by the rate at which the G stages are traversed; since the number G of stages is set by the data at delay control input port 25b, this rate is established by the rate at which the input data is written into the next subsequent stage (from stage 1 to stage G) by the $\overline{R/W}$ signal, which is the half-sample $f_S/2$ signal. At each of output ports 66-1c or 66-2c each of the N-bits of each data word are each coupled to the associated data D input of a pair of data latch means 68-1 or 68-2, respectively, each receiving its clock C signal at the half-sample-frequency rate. The latched signals appearing at the Q outputs of latches 68-1 or 68-2 are coupled to the output ports 25c-1 or 25c-2 as signals ($I_1$ or $I_2$) or ($Q_1$ or $Q_2$), dependent upon whether the input signal was (I or $I_1$) or (Q or $Q_1$). The half-sample-frequency clock signal is made available at output 25c-3.

Referring now to FIG. 1c, delay control means 38 may also be considered as a RAM sequential address generator, in that the rate at which the addresses of the G stages of RAM means 66-1 or 66-2 are sequentially selected establishes the delay in each of the first delay means 25-1 or the second delay means 25-2, respectively. The shift stage count for each of the RAMs (for the I channel or the Q channel, respectively) is established by a first counter means 70-1 (for the first delay means 25-1) or by a second counter means 70-2 (for the second delay means 25-2). For G=256 stages, each counter means comprises a pair of four-stage presettable counter circuits 71a and 72b or 72a and 72b such as provided by the integratable circuitry as in a standard 74LS163 and the like integrated circuits. The preset inputs for each of the eight stages of the first delay means are normally pulley toward the logic supply +V voltage through an associated one of pull-up resistors 71r, but may be connected to ground potential through the associated bit A0–A7 delay setting means 71s. The second delay means counter stages 72a and 72b also receive presetting inputs, but as the second delay means time delay $T_2$ must be equal to the difference between the fixed two-time-constant ($2/R_b$) total delay and the first means variable delay $T_1$, these presetting inputs are provided at the summation outputs of a pair of adder means 73a and 73b (each realizable with integratable circuitry as in a standard 74LS283 and the like integrated circuit), having a first set of A inputs receiving, for subtraction, a two's-complement set of the first delay means data bits A0–A7, and a second set of B inputs receiving second delay means setting data available at the bit B0–B7 junctions between a second delay means set of pull-up resistors 72r and delay setting switch means 72s. It should be understood that either, or both, of the first and second delay setting switch means 71s and 72s need not be a bank of switches physically settable by an operator, but can rather be high impedance/low impedance states of switching devices. Thus, delay setting means 72s can be a set of switches for semi-permanently setting the overall delay (2T) responsive to the system data transfer rate (e.g., 9100 bps), and means 71s can be a register receiving a plurality V of bits of data from input 38a, as controlled by the bit synchronization means output 36b, for setting the first delay means delays $T_1$ and thus also setting the second delay means delay $T_2$, according to the most recent data at input 38a and responsive to a clock C signal related to the sample-frequency signal which pervades the detector and acts as a standard reference frequency therefore.

Referring now to FIG. 1', we presently prefer to implement both the sine and cosine detection means 29-1 and 29-2, respectively, as a single sin/cos detection means 29. Accordingly, the N-bits of each of the in-phase I and quadrature-phased Q signals are applied to respective input ports 29a-1 and 29a-2, while the N-bits of the once-delayed in-phase signal $I_1$ and quadrature-phased signal $Q_1$ are applied to respective second input ports 29a-3 and 29a-4, with the N-bits of the twice delayed in-phase signal $I_2$ and quadrature-phased signal $Q_2$ being applied to respective third input ports 29a-5 and 29a-6. The resulting P-bits of sine output signal S(t) are provided at first output port 29b-1, while the resulting P-bits of cosine output signal C(t) are provided at second output port 29b-2.

Figure 1D:
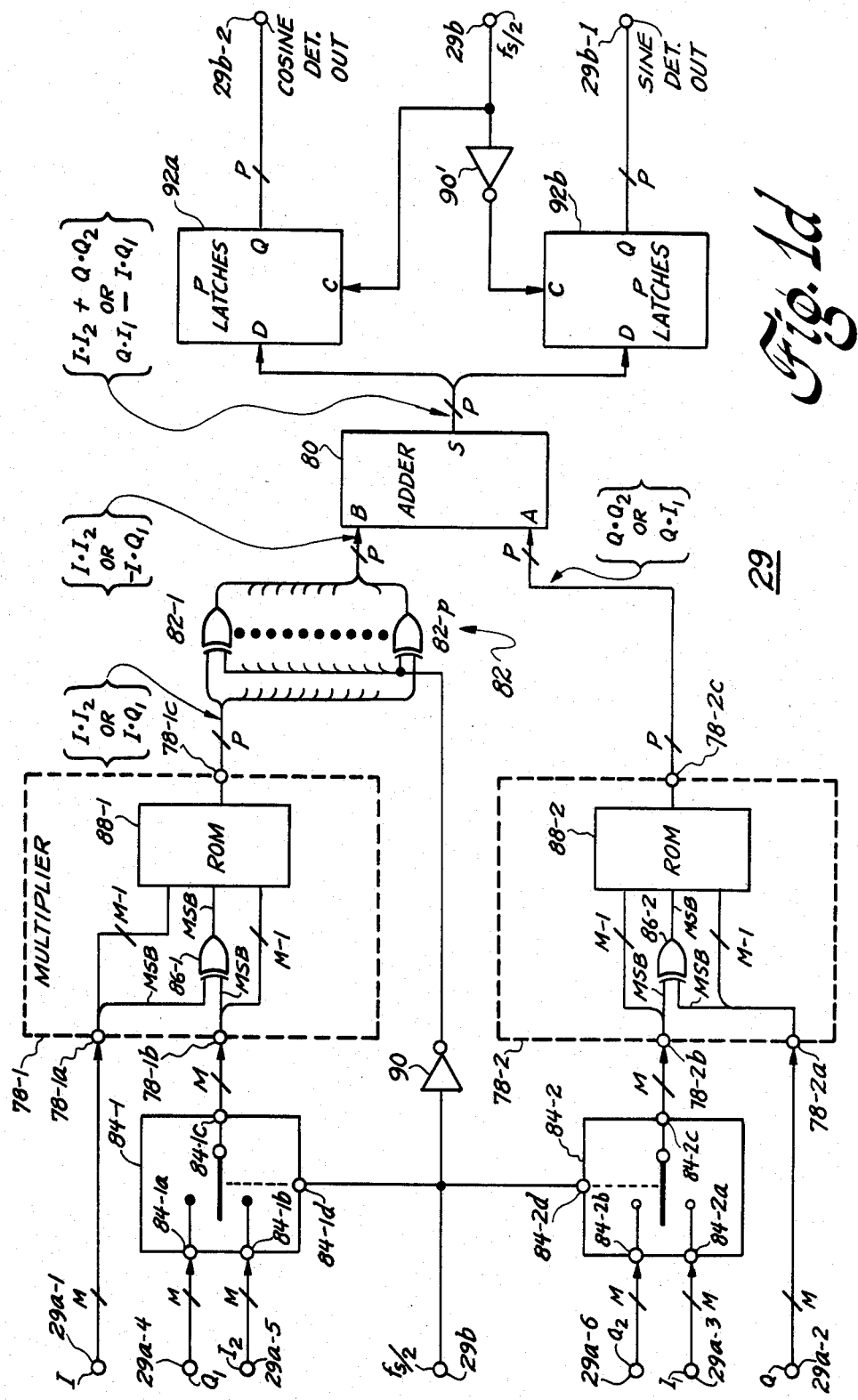
FIG. 1d is a schematic block diagram of circuitry for realizing one presently preferred embodiment of the unitary discriminator-differential detector means.

The logic of unitary sin/cos detection means 29 is shown in greater detail in FIG. 1d. Each detection requires a pair of multiplication operations and an addition operation (with the sine detection operation of subtraction being the same as taking the complement of the subtrahend prior to summation). Accordingly, dual detector means 29 utilizes a pair of digital multiplier means 78-1 and 78-2, an adder means 80 and a two's complementary means 82. First multiplier means 78-1 receives M bits of the in-phase I data signal from first detector input port 29a-1 at a first input port 78-1a, and receives at a second input port 78-1b another M bits of digital data from the M output lines of a first signal selecting means 84-1. The selecting means M first selectable terminals 84-1a or M second selectable terminals 84-1b are themselves respectively connected to receive the respective M bits of singly-delayed quadrature-phased $Q_1$ signal data at input port 29a-4 or to receive the respective M bits of the doubly-delayed in-phase $I_2$ signal data at input port 29a-5. The P bits of $Q_1$ signal data or $I_2$ signal data are provided at the first switching means output port 84-1c responsive to the logic state of a select signal at a select input 84-1d. This select signal is the half-sample-frequency signal at input 29b. Second multiplier means 78-2 receives the M bits of the quadrature phase Q signal data from second detector input port 29a-2 at a first input port 78-2a, and receives at a second input port 78-2b another M bits of digital data from a second signal selecting means 84-2. The selecting means selectable terminals 84-2a or 84-2b are themselves respectively connected to the respective delayed in-phase $I_1$ signal data at input port 29a-3 or the doubly-delayed quadrature-phase $Q_2$ signal data at input port 29a-6. The selected $I_1$ signal data or the $Q_2$ signal data is provided at the first switching means output port 84-2c responsive to the logic state of the select signal at a select input 84-2d.

In each of multiplier 78-1 or 78-2, the most significant bit (MSB) of the data word at each of the first and second input ports 78-1a and 78-1b or ports 78-2a and 78-2b is connected to a different input of a two-input exclusive-OR gate 86-1 or 86-2. The gate output is the MSB bit of an address data word having (2M-1) bits; the remaining 2(M-1) bits of the address data word are obtained from the remaining (M-1) bits of data available at each of the two inputs. This (2M-1) bit address data word is applied to the address port of a pre-programmed read-only memory (ROM) means 88-1 or 88-2. In the present illustrated embodiment, wherein M=6, each of the essentially identical programmed ROM means 88 is a standard integratable ROM structure with 16K bits of data, organized as $2^{(2M-1)} = 2^{11} = 2048$ different addressable words each with a width of 8 data bits (as may be found in type 2716 ROMs). Thus, a P-bit data product word (here with P=8) is provided at each multiplier output port 78-1c or 78-2c. Because switching means 84-1 and 84-2 are enabled to transmit the alternating ($Q_1$ or $I_2$) or ($Q_2$ or $I_1$) data inputs responsive to alternate high and low logic levels of the half-sample-frequency signal, each multiplier output will be a "true" product only for that product word containing the term selected when input 29b is at a high logic level, e.g., when common terminals 84-1c or 84-2c are connected to second selectable terminals 84-1b or 84-2b, so that the $I \cdot I_2$ product at first multiplier output port 78-1c is "true", as is the $Q \cdot Q_2$ product at the second multiplier output port 78-2c. Conversely, the product formed when the signal at input 29b is at the opposite, e.g., low, logic level will have a "complemented" product at the associated multiplier output port; thus, the first multiplier output port 78-1c yields the product term ($I \cdot Q_1$) responsive to the $Q_1$ signal being connected through selection means 84-1 to first multiplier second input port 78-1b, while the second multiplier output port 78-2c has the product term ($Q \cdot I_1$) responsive to the $I_1$ data being selected by second selection means 84-2 for application to second multiplier second input port 78-2b. It will be seen that the digital signals at second mulipler output port 78-2c can be applied directly to a first A input of adder 80, but that the sign of the first multiplier output data, provided when the signal at input port 29b is at a logic low level, must be itself complemented to yield the correct product term $(-I \cdot Q_1)$. Accordingly, each of the P data lines at first multiplier output port 78-1c is connected to one input of an associated one of a like number P of exclusive-OR gates 82-1 through 82-p, each having the remaining input connected to the output of an inverter 90, receiving as its input the half-sample-frequency signal at input 29b. During the half-cycle of the input 29b signal which is at a high logic level, no effective inversion of the first multiplier output signal occurs and the adder second input B port receives the ($I \cdot I_2$) signal. However, during the low logic level half-cycle of the signal at input 29b, the gate second inputs are inverted and the two's complement signal $-(I \cdot Q_1) = (-I \cdot Q_1)$ is provided at the adder input B port. Responsive to these inputs, the adder summation S output port provides a P-bit-wide output word which is, with the half-sample-frequency at a logic high, the cosine, or differentiator, detector signal $A + B = I \cdot I_2 + Q \cdot Q_2$; when the signal at input 29b is at a logic low level, the adder output S port provides the P-bit-wide signal ($Q \cdot I_1 - I \cdot Q_1$), which is the sine, or discriminator, detector output. Since the adder output changes on a half-cycle basis, it is desirable to store the output data from each half-cycle in a separate latch means 92a or 92b, so that each of the sine and cosine detector signals can be continuously provided at the appropriate output, even while being updated in alternating manner. Accordingly, the half-sample-frequency signal at input 29b is directly applied to each clock C input of a plurality P of cosine output latch means 92a, each having its data D input receiving a different associated one of P data bits of the adder output for the cosine function and latching that data during the simultaneously appropriate half-cycle of the half-sample-frequency signal, for making those P bits available at the Q outputs of the plurality of latches 92a, to the cosine detector output port 29b-2. Similarly, the half-sample-frequency signal is inverted in another inverter means 90' and is applied to each of the clock C inputs of a second set of a plurality P of latch means 92b, each having a data D input receiving an associated different one of the P adder bit outputs and latching that data during the opposite half cycle of the half-sample-frequency waveform, to provide the latched signals at the Q outputs thereof to the sine detector output port 29b-1.

Referring now to FIG. 1e, by way of illustration only, one possible implementation for a single-pole, infinite-impulse-response (IIR) digital filter means 34 utilizes a pair of divide-by-T means 94a and 94b (for dividing the data "amplitude" by T=8, as by hardwiring the appropriate shift-3-bit functions on the binary data), a pair of R-bit adder means 96a and 96b (which, for R=12, may be as in a plurality, e.g., three, of standard 74LS283 adders) and a pair of delay/output R-bit latch means 98a and 98b (of the 'LS374 form), in addition to an inverter means 99 formed of R inverters means 99a through 99r. This filter is based upon feedback of a seven-eighth multiple of the delayed sum to the summing adder 96a. The delayed $\frac{7}{8}$-th data means 100 adds the two's complement (formed by inverter means 99) data of $\frac{1}{8}$-th of the input delayed data (after a delay in delay latches 98a and "division" by eight in counter means 94b) at the A input port, to the delayed data at the B input port, to obtain the $\frac{7}{8}$-th delayed data at the S port, for introduction to the B port of first adder 96a.

Figure 1F:
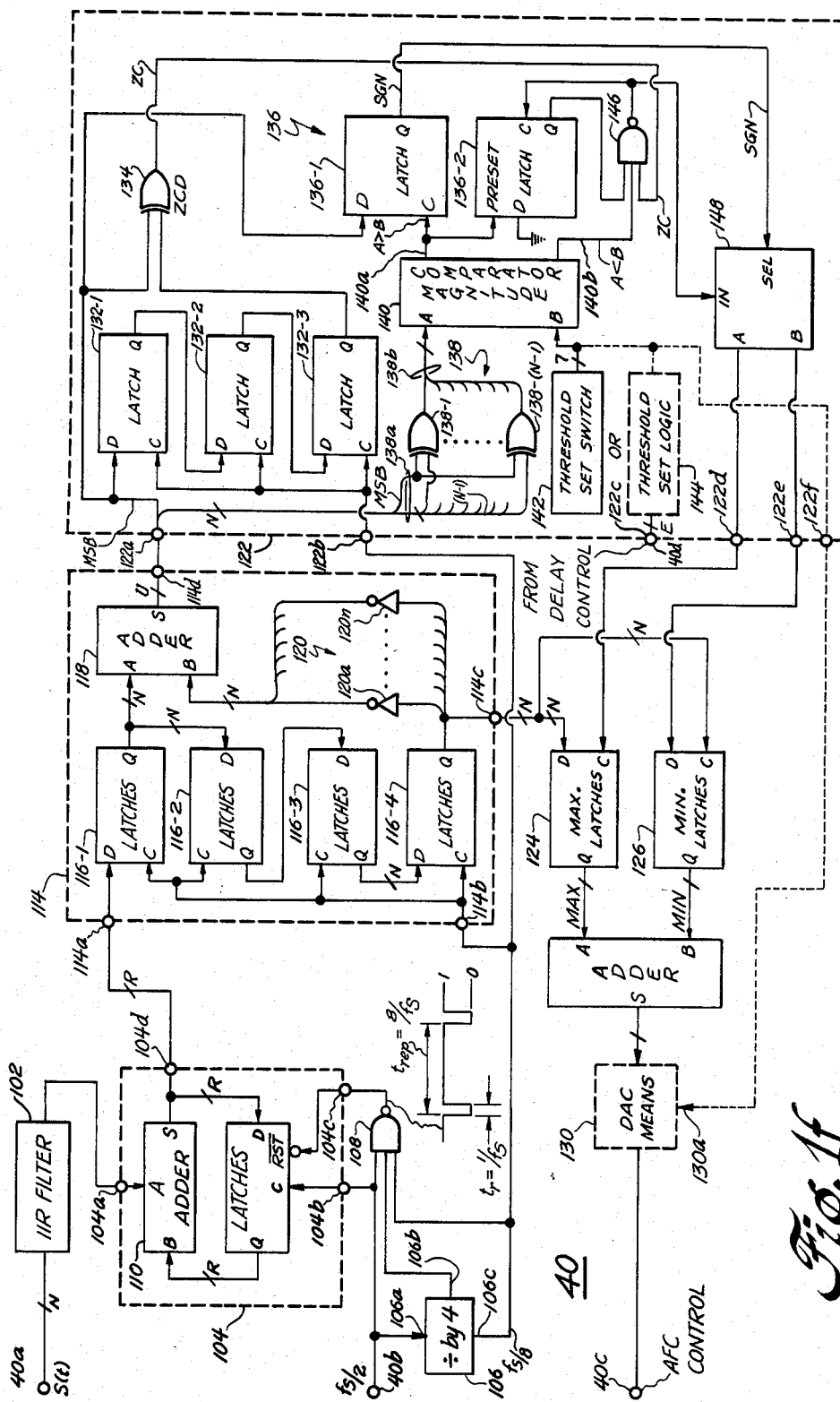
FIG. 1f is a schematic block diagram of circuitry for realizing one presently preferred embodiment of the automatic frequency control means.

Referring now to FIG. 1f, the automatic frequency control (AFC) means 40 receives the sine S(t) digital signal, from the output of the discriminator detector, at its input 40a. This N-bit digital signal may be low-pass filtered in a IIR filter means 102, similar to filter means 34 already described hereinabove with respect to FIG. 1e. The filtered discriminator data is applied to a first input 104a of an integrate-four-samples-then-dump means 104, which operates for reducing the apparent rate at which the incoming data was sampled. Means 104 receives a clock signal at a second input 104b, from a half-sample-frequency signal input 40b of the AFC means. A reset signal is provided at another means input 104c. The resulting sample-reduced data is made available at a means output port 104d. The reset signal is provided by connection of a clock input 106a of a divide-by-four counter means 106 to means input 40b, along with one input of a three-input NAND gate 108. A first binary counter stage (i.e., a divide-by-two) output 106b is connected to a second input of gate 108, while a second binary counter stage (i.e., a divide-by-four) output 106c is connected to the remaining gate input. The gate output is a normally high logic signal which falls to a low logic level for one-half of the duration of a cycle of the input 40b waveform, once every input wafveform cycles. The filtered discriminator data at input port 104a is applied to the first A data port of an adder means 110. The summation S port of the adder means is coupled to not only the means output port 104d, but also to the data D inputs of a R-bit latch means 112, receiving the reset signal from input 104c and the clock signal from input 104b. The latch Q outputs provide R bits of data to the second B input port of adder means 110. In operation, means 104 is reset at the end of every fourth cycle of the half-sample-frequency clock signal at input 40b. Immediately after the resetting of latch means 112, the filtered discriminator output signal data, at adder input A, is added to the now-zero latched data at adder input B, and the sum (equal only to the S data at input 104a) is provided to the latch means data D inputs. Responsive to the rising edge of a first clock C signal at input 104b, this data is stored in latch means 112 and made available to the second adder input B. Newly filtered second-sample data is then added to the latched first-sample data and appears at the adder summation S output to be latched into latch means 112 at the rising edge of a second clock C signal of each sequence. Thereafter, this latched first-sample plus second-sample data is added to a third data sample, and thence to a fourth data sample. The summed four sample data is provided by the output port 104d immediately prior to the reset input receiving a low logic level resetting pulse, and is equivalent to integrating four samples, prior to a dump of the integrated data preparatory for the next integration cycle.

This AFC means 40 operates by monitoring the minimum and maximum excursions of the discriminator (sine) detector output, utilizing maximum and minimum track-and-hold circuits which are controlled by a differentiator-based peak detection circuit. After the sampling rate of the discriminator filtered output is reduced, utilizing the integrate-and-dump means 104, the resulting reduced-sample signal is differentiated, so that the zero crossings of the first signal waveform derivative, which corresponds to the maxima and minimum of the signal itself, can be utilized for the maximum and minimum excursion monitoring. Thus, the sampled, filtered data is provided to a data input port 114a of a digital differentiator means 114, which also receives the reduced-sample (one-eighth-sample-frequency) clock signal at a clock input 114b. The clock input 114b is connected to the clock C inputs of each of four different sets 116 of latch means. Each of the first set 116-1 of a plurality R of data latches receives at its data D input an associated one of the R data lines at input port 114a. This data is latched into the first latch set on the rising edge of each of the reduced-sample-rate clock signals at clock input 114b. Responsive thereto, the new data is provided at the Q outputs of the first data latch set in parallel both to a first input port A of an adder means 118, and also to the data D inputs of a second set 116-2 of latches. The respective Q outputs of the second latch set 116-2 are respectively connected to the associated data D input of a third latch set 116-3, each having its Q output connected to the associated data D input of a fourth latch set 116-4, which itself has its Q outputs connected in parallel to a three-sample-delayed data output port 114c and also to a two's-complementer means 120. The complementer means contains a plurality N of inverters 120a-120n, which provide the two's complement of the three-sample-delayed data signal to the second input B port of adder means 118. Adder means 118 has its summation S output port connected to a differentiator means output data port 114d. In operation, the sample-and-held data at input 114a is latched into first latch set 116-1, on the rising edge of the one-eighth sample-frequency pulse at input 114b, and thereafter made available at one adder input A. Simultaneously, the data is made available at the data inputs of latch set 116-2; responsive to the next three positive-going edges of the clock signal at input 114b, the parallel data is clocked through latch sets 116-2 through 116-4. The three-sample-delayed data, after complementing in means 120, appears at the adder second input B, where the addition of the two's-complemented data is equivalent to subtraction of the thrice-delayed data from the data now present at the Q outputs of first latch set 116-1. If the difference is zero, as indicated by an adder summation S output data signal, at output port 114d, of zero, the sine detector/discriminator output signal change has a zero magnitude, i.e., $dS/dt = 0$, and a maxmia or minima has been achieved.

A threshold detector is utilized to determine whether a particular zero crossing of the discriminator output signal derivative is a maximum or minimum. Thus, the magnitude of the derivative as compared to a threshold value; if the magnitude data value is respectively less than or greater than the threshold data value, then a derivative sign data bit of respective "positive" or "negative" value is latched in a controller means. If the latched sign data bit represents a positive sign, then the next zero crossing of the derivative corresponds to a signal maximum and is to be stored in a maximum latch means 124. If the latched sign data bit represents a negative sign, than the next zero crossing of the derivative corresponds to a signal minimum and is to be stored in a minimum latch means 126. The maximum and minimum values are added to one another in an adder means 128, to provide a signal average having a magnitude responsive to the frequency error, and utilizable for automatic frequency control. Dependent upon the form of control oscillator means 15 utilized, a digital-to-analog converter means 130 may be utilized to provide the AFC control voltage, at AFC means output 40c, as an analog signal, rather than as a digital signal.

Controller means 122 receives the differentiator output signal at a differentiator signal input 122a, and receives the $f_S/8$ clock signal at a second input 122b. The clock signals at input 122b are connected to the clock C inputs of three individual latch means 132. The most significant bit (MSB) of the data at input port 122a is connected to the data D input of the first latch 132-1, as well as to one input of an exclusive-OR gate 134 (utilized as a zero crossing detector (ZCD) means) and to the data D input of a second latch means 136-1, forming a portion of a min./max. control means 136. The entire input data word is also connected from data input 122a to the input port 138a of a complementer means 138. The complementer, which contains a plurality $(n-1)$ of exclusive-OR gates 138-1 through 138-$(n-1)$, has a first input of each gate receiving the MSB bit, while the remaining input of each gate receives an associated one of the $(N-1)$ remaining bits of the input signal. The $(n-1)$ gate outputs form the complementer output port 138b, for connection to a first input port A of a magnitude comparator means 140. The remaining input B port of the magnitude comparator means receives an identical number, e.g., $(n-1)=7$, of data bits from a threshold setting means, such as a threshold set switch means 142, which may be permanently set in an integrated circuit, or may be external to the detector integrated circuit. Alternatively, some threshold set logic means 144 can be utilized with the E-bit-wide signal at input 40d, from delay control means 38, for providing this second input B port data to the magnitude comparator; the use of threshold logic with a delay-control-means-provided signal is normally unnecessary, but may be provided for if the control characteristics of the control oscillator means, or any other portion of the receiver 10, so require.

The MSB data bit provided to the data D input of first latch means 132-1 is latched to the Q output thereof, responsive to the next-occurring clock signal at input 22b. This one-clock-delayed signal is then sequentially clocked through the second and third latch means 132-2 and 132-3, respectively, on the second and third clock signals at input 22b, to appear as a three-delayed signal at the Q output of third latch means 132-3, and at the second input of ZCD gate means 134. Only if both inputs to gate means 134 are at the same logic level, indicative of zero crossing, will a zero crossing ZC output signal be provided at a high logic level. The ZC signal at the output of gate 134 is provided to one input of a three-input NAND gate 146. A second input of gate 146 receives a comparator (A<B) output of magnitude comparator 140. An opposite magnitude comparator output, for the condition where the data at input A is greater than the data at input B (i.e., A>B), is connected to a clock C input of a first controller latch means 136-1 and to a preset input of a controller second latch means 136-2. The first controller latch means 136-1, as previously noted, receives the MSB bit of input data at its data D input, for providing a logic signal at its Q output which is established responsive to the sign (SGN) of the input signal, and which is furnished to the selection SEL input of a one-to-two de-multiplexer means 148. The second controller latch means 136-2 has a data D input connected to ground potential, a Q output connected to the remaining third input of the NAND gate 146, and a clock C input receiving the output signal of gate 146, which signal is also provided to the data input IN of the de-multiplexer means 148. The A output of the de-multiplexer means is connected to provide a first means output 122d, to the clock C inputs of the plurality N of the maximum latch means 124; the other B output of the de-multiplexer means is connected, through a second means output 122e, to the clock C inputs of the like plurality N of the minimum latch means 126. The non-complemented data from differentiator data port 114c is connected, in parallel, to the data D inputs of both the minimum and maximum latch means 124 and 126, respectively.

In operation, the three-delayed most significant bit of the input data word is compared with the undelayed most significant data bit to provide the ZC zero crossing signal whenever a zero crossing is detected. The complemented data, from means 138 added is in means 140 to the set threshold data, from means 142 (or means 144, if require). As adding complemented data is equivalent to subtracting that data from the theshold set data at the input B of the magnitude comparator adder 140, the magnitude comparator outputs will have logic states determined by the signal value when the zero crossing ZC signal is enabled. The signal value is either greater than the threshold (enabling magnitude comparator output 140a, when a signal maximum value is reached) or is less than the threshold value (enabling comparator output 140b, when a data minimum value is present). Thus, a maximum value indication will provide a rising logic level at the clock C input of first controller latch means 136-1, latching the MSB bit through to the Q output thereof, to determine the SGN logic level, and, therefore, the routing of input data through de-multiplexer means 148. Simultaneously, for a maximum value, the second controller latch means is preset to raise the Q output thereof. Thus, the output of gate 146 will be pulsed to a high logic level for each zero crossing; this positive-going pulse is provided to the input of the multiplexer 148. The routing of the pulse, through de-multiplexer 148, is determined by the sign of the data. If a maximum has been detected, the pulse is, responsive to the SGN signal being at a high logic level, routed to multiplexer output A, at means output 122d, and thence to the clock C input of max latch means 124, to cause the N bits of data to each be captured in the associated one of the N latches of means 124 and provided at the associated Q output thereof, as max data to the input A port of adder means 128. If the SGN signal is at a low logic level, the pulse at the IN input of demultiplex means 148 appears at the B selected output and at the means output 122e, for application as the clock signal to the clock C inputs of the plurality N of min. latch means 126. The N bits of data supplied respectively to the associated respective data D inputs are therefore clocked through to the Q outputs and are applied as the MIN data to the second B input of adder means 128. Since the average of a pair of data sets is proportional to the sum of the two sets of data, the summation data at the S output of adder 128 is proportional to the average frequency. A digital frequency control signal can be taken directly from the adder summation output S, or can first be converted to an analog signal by DAC means 130, before being presented at the frequency control output 40c. The delay control data can be used, if required, via an output 122f, to provide a multiplicand at another input port 130a of a multiplying DAC.

Figure 2:
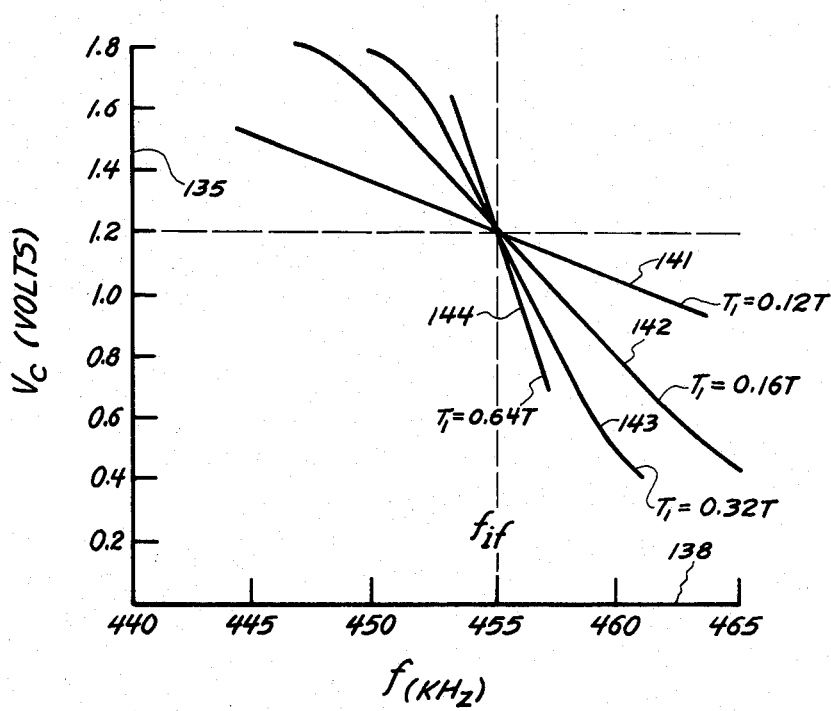
FIG. 2 is a graphical representation of the magnitude of the frequency control signal with respect to the input frequency for the detector of FIG. 1, with several different values of sine detector delay $T_1$.

Referring now to FIG. 2, the controlled oscillator control signal voltage $V_c$ is plotted along ordinate 135, for instantaneous IF frequencies f, plotted in KHz., along abscissa 138. For the minimum sine discriminator delay $T_1$, of about 0.12T, curve 141 illustrates that relatively large excursions in the intermediate frequency ($f_{if}$) of about ±10 KHz. can be tailored to a desired control voltage excursion, e.g., ±0.3 volts. This yields a relatively-low first frequency sensitivity factor $k_1$, e.g., about 0.03 V/KHz., which can be utilized, amongst other purposes, for supplying a first multiplication factor to the DAC means, via connection of the multiplication constant input 130a thereof through the controller output 122f. Therefore, if the E bits of set-delay data correspond to the first constant $k_1$, a first multiplier, e.g., 33, can be utilized to set the sensitivity of oscillator means 15 to a first value. As the delay is increased, as to a second value for second curve 142, e.g., $T_1=0.16T$, the discriminator sensitivity effectively increases, responsive to the decreasing of the frequency offset; and a lower multiplication value may be required, to maintain the control voltage $V_c$ with the same overall sensitivity, as set by the controlled oscillator means 15 characteristics. Similarly, as the delay control means 38 increases the discriminator sensitivity, to third, fourth, ... sensitivities, wherein constants $k_3$, $k_4$, ... have increased values, e.g., with $T_1=0.32T$, $T_1=0.64T$, ..., the response may be suitably shaped for the particular oscillator means utilized.

While one presently preferred embodiment of our novel variable-delay, sine-cosine non-coherent demodulator, providable in a form comprised essentially only of circuitry implementable in digital form, so as to be completely integratable into a single monolithic integrated circuit, has been described herein. Many modifications and variations will now become apparent to those skilled in the art. It is out intent, therefore, to be limited only by the scope of the appended claims and not by the specific details and instrumentalities presented by way of explanation of a single presently preferred embodiment herein of our novel demodulator.

What we claim is:

1. A demodulator for recovering information angle-modulated onto a radio-frequency (RF) carrier signal, comprising:

means for converting the frequency of the RF carrier signal to an IF signal at a frequency close to a desired demodulation frequency;

means for providing a digital sampling signal at a sample frequency which is a selected integer H multiple of the demodulation frequency;

means for converting the IF signal into a pair of time-current baseband quadrature-phased I and Q digital data words responsive to alternate cycles of said sampling signal;

first means for delaying each of the respective I and Q data words by a first selected time interval $T_1$ to provide respective first-delayed $I_1$ and $Q_1$ data words;

second means for delaying each of the respective $I_1$ and $Q_1$ data words by a second selected time interval $T_2$ to provide second-delayed respective $I_2$ and $Q_2$ data words;

detector means for providing a first detector data word and a second detector data word respectively responsive to the sine and cosine of the instantaneous difference between the IF signal frequency and the sampling signal frequency;

means for selecting one of the first and second detector data words as a demodulator output data signal;

means for controlling both the first delay time interval $T_1$, responsive to an offset data signal proportional to the average frequency separation between the IF and sampling frequencies, and the second delay time interval $T_2$, as the difference between the present first delay time interval and a total delay time inversely proportional to the sampling frequency; and AFC means, receiving at least the first detector data word and controlling the carrier signal converting means, for minimizing the separation between the actual IF signal frequency and a submultiple, set by division, by the same integer H, of the sampling frequency.

2. The demodulator of claim 1, further comprising means for filtering noise from the selected detector data word prior to providing the filtered data as the demodulator output signal.

3. The demodulator of claim 2, wherein the filtering means is an infinite-impulse-response filter.

4. The demodulator of claim 1, wherein substantially all of said means are integrated into a single monolithic integrated circuit.

5. The demodulator of claim 1, wherein said detector means comprises: discriminator detector means for providing said first dataword, responsive to $(I \cdot Q_1 - Q \cdot I_1)$; and differential detector means for providing said second data word, responsive to $(I \cdot I_2 + Q \cdot Q_2)$.

6. The demodulator of claim 1, wherein said detector means comprises: first means for multiplying the I data word by a selected one of the $Q_1$ and $I_2$ data words to alternatingly produce an associated one of first and second digital product words, responsive to respective first and second states of the sampling signal; second means for multiplying the Q data word by a selected one of the $Q_2$ and $I_1$ data words to alternatingly produce an associated one of third and fourth digital product words, responsive to respective first and second states of the sampling signal; means for complementing the data of the second product word; and means for adding the first and third digital product words to provide the first detector data word and for adding the complemented second and fourth digital product words to provide the second detector data word.

7. The demodulator of claim 6, wherein said detector means further comprises means for acquiring the respective first and second detector data words during the respective first and second sampling signal states for temporary storage of that detector data word as the associated detector means data word output until the next subsequent acquisition of that detector data word.

8. The demodulator of claim 1, wherein said IF signal converting means comprises: means for sampling the IF signal responsive to each cycle of the sampling signal and for converting the amplitude of the sampled IF signal to a digital data word; and means for sorting each sequential pair of digital data words into said pair of time-concurrent baseband quadrature-phased I and Q digital data words.

9. The demodulator of claim 8, wherein said sorting means comprises: means for selectively complementing alternating ones of said data word pairs, responsive to the logic state of said sampling signal; means for temporarily storing each pair of associated uncomplemented and complemented data words; and means for delaying one of the complemented and uncomplemented data words prior to temporary storage.

10. The demodulator of claim 1, wherein said carrier signal converting means comprises: means for generating a local oscillator (LO) signal at a frequency controlled by a control signal; and mixer means for heterodyning the carrier signal and the LO signal to produce said IF signal.

11. The demodulator of claim 10, wherein the IF signal frequency as about one-fourth of the sample signal frequency.

12. The demodulator of claim 1, wherein said AFC means comprises: means for determining the maximum and minimum data values of the first detector data word in each of a sequential plurality of preselected time intervals; and means for using the average of the determined maximum and minimum data values to minimize said frequency separation.

13. The demodulator of claim 12, wherein said determining means comprises: means for differentiating the first detector data word; means for providing a zero crossing signal when the differentiated data word has a substantially zero magnitude; means for determining the polarity of the slope of the differentiated data word; means for storing each of the maximum and minimum data values; and means for providing a first signal to said storing means to cause the present value of said first detector data word to be stored as the respective maximum or minimum data value responsive to the zero crossing signal being provided while the slope has a respective negative or positive polarity.

14. The demodulator of claim 13, wherein said differentiating means comprises: means for temporarily holding each of a sequence of the first detector data words; means for delaying each held data word for a predetermined delay time interval; and means for subtracting the delayed data from the data then held in said holding means to provide the differentiated data word.

15. The demodulator of claim 12, wherein said AFC means further comprises means for integrating a plurality of sequential ones of the first detector data words.

16. The demodulator of claim 12, further comprising means prior to said determining means, for filtering noise from a sequence of first detector data words.

17. The demodulator of claim 1, wherein at least one of said first second delaying means comprises: means for sequentially transferring each of the pair of quadrature-phase data words, provided as sequential input to the delaying means, through a plurality of storage locations responsive to delay time data provided by said delay controlling means; and means for temporarily storing the last data word pair temporarily present at the last storage location until a next subsequent data word pair is presented.

18. The demodulator of claim 17, wherein the transferring means comprises at least one random access memory.

19. The demodulator of claim 1, wherein information has been modulated onto the carrier signal with one of phase shift keying and continuous-phase frequency shift keying, and the output data selecting means selects the second detector data words as the demodulator output data words.

20. The demodulator of claim 1, wherein information has been modulated onto the carrier signal with one frequency shift keying and frequency modulation, and the output data selecting means selects first detector data words as the demodulator output data words.

* * * * *